United States Patent
Gupta et al.

(10) Patent No.: US 9,553,594 B1
(45) Date of Patent: Jan. 24, 2017

(54) DELAY-LOCKED LOOP WITH FALSE-LOCK DETECTION AND RECOVERY CIRCUIT

(71) Applicant: FREESCALE SEMICONDUCTOR, INC., Austin, TX (US)

(72) Inventors: Atul Gupta, Noida (IN); Risi Jaiswal, Chauk-Bazar (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/968,918

(22) Filed: Dec. 15, 2015

(51) Int. Cl.
| | |
|---|---|
| H03L 7/06 | (2006.01) |
| H03L 7/08 | (2006.01) |
| H03L 7/081 | (2006.01) |
| H03L 7/087 | (2006.01) |
| H03L 7/089 | (2006.01) |
| H03L 7/18 | (2006.01) |

(52) U.S. Cl.
CPC ............ *H03L 7/0807* (2013.01); *H03L 7/087* (2013.01); *H03L 7/0812* (2013.01); *H03L 7/0891* (2013.01); *H03L 7/18* (2013.01)

(58) Field of Classification Search
CPC ........ H03L 7/18; H03L 7/0812; H03L 7/0807; H03L 7/087; H03L 7/0891
USPC ......................................................... 327/158
See application file for complete search history.

(56) References Cited

U.S. PATENT DOCUMENTS

| | | | |
|---|---|---|---|
| 5,488,641 A * | 1/1996 | Ozkan | .................. H03L 7/0814 327/150 |
| 6,239,634 B1 | 5/2001 | McDonagh | |
| 6,452,431 B1 | 9/2002 | Waldrop | |
| 6,665,230 B1 | 12/2003 | Shrader et al. | |
| 6,680,634 B1 | 1/2004 | Ruha et al. | |
| 6,844,761 B2 | 1/2005 | Byun et al. | |
| 6,917,660 B2 * | 7/2005 | Song | .......................... G11C 7/22 370/519 |
| 7,030,675 B1 * | 4/2006 | Wang | ................... H03K 5/1252 327/262 |
| 7,034,591 B2 | 4/2006 | Wang | |
| 7,099,232 B2 | 8/2006 | Kwak | |
| 7,157,949 B2 | 1/2007 | Chen et al. | |
| 7,161,402 B1 | 1/2007 | Sompur | |
| 7,233,182 B1 | 6/2007 | Savoj | |
| 7,298,191 B2 | 11/2007 | Wu et al. | |
| 7,323,915 B2 | 1/2008 | Josephson | |

(Continued)

OTHER PUBLICATIONS

Yang. Chi-Kong Ken; "Delay-Locked Loops—An Overview, Phase Locking in High Performance Systems", IEEE Press, 2003, pp. 13-22.

Primary Examiner — Ryan Jager
(74) Attorney, Agent, or Firm — Charles E. Bergere

(57) ABSTRACT

A DLL includes a phase detector, a counter, a delay circuit, and a false-lock detection and recovery circuit. The false-lock detection and recovery circuit checks whether the DLL is in a true-lock condition or not, based on an average of a phase difference between a clock signal and an intermediate clock signal. The intermediate clock signal is generated by the delay circuit based on a count value generated by the counter and a select signal generated by the false-lock detection and recovery circuit. The false-lock detection and recovery circuit generates and provides a control signal to the counter. Based on the control signal, the counter modifies the count on which a delay between the clock signal and an output signal of the DLL depends when the DLL is not in the true-lock condition.

17 Claims, 5 Drawing Sheets

(56) References Cited

U.S. PATENT DOCUMENTS

| | | | |
|---|---|---|---|
| 7,336,112 B1 | 2/2008 | Sha et al. | |
| 7,358,784 B2 | 4/2008 | Kim | |
| 7,471,130 B2 | 12/2008 | Gomm | |
| 7,495,486 B2 | 2/2009 | Lee | |
| 7,593,273 B2* | 9/2009 | Chu | G11C 7/1051 |
| | | | 365/193 |
| 7,733,138 B2 | 6/2010 | Uehara et al. | |
| 7,872,494 B2 | 1/2011 | Welker et al. | |
| 7,957,218 B2 | 6/2011 | Welker et al. | |
| 8,248,106 B1 | 8/2012 | Cohen | |
| 8,310,292 B1 | 11/2012 | Phan | |
| 8,368,445 B2 | 2/2013 | Lin et al. | |
| 8,787,097 B1 | 7/2014 | Chong et al. | |
| 2008/0042698 A1* | 2/2008 | Kim | H03L 7/0812 |
| | | | 327/116 |
| 2008/0042704 A1* | 2/2008 | Na | H03L 7/0814 |
| | | | 327/158 |
| 2012/0124409 A1* | 5/2012 | Miyano | G06F 1/10 |
| | | | 713/503 |
| 2013/0342251 A1* | 12/2013 | Patel | H03L 7/08 |
| | | | 327/158 |

* cited by examiner

DELAY-LOCKED LOOP WITH FALSE-LOCK DETECTION AND RECOVERY CIRCUIT

BACKGROUND

The present invention generally relates to integrated circuits, and, more particularly, to a delay-locked loop (DLL).

Delay locked-loops (DLLs) are used in integrated circuits for eliminating clock skew and generating multi-phase clock signals. A DLL delays an external clock signal to generate an internal clock signal (i.e., a delayed clock signal), which is used to synchronize the operations of components within a system. The delayed clock signal has the same frequency as that of the external clock signal.

To synchronize the delayed clock signal with the external clock signal, the DLL compares a phase difference between the two and introduces a delay between them until the two clock signals are synchronized. The DLL enters a false-lock condition when a feedback loop in the DLL settles at a delay that is a multiple of $2\pi$ radians. Conventional DLLs cannot recover from this situation, and hence, may fail to achieve the desired delay of $2\pi$ radians between the delayed clock signal and the external clock signal.

A known technique to overcome the false-lock condition is to use a false-lock detection circuit that detects the false-lock condition using intermediate clock signals generated by a delay chain. The false-lock detection circuit modifies a count value for selecting an intermediate clock signal, which is then output as the delayed clock signal by the delay chain. Since this false-lock detection circuit uses multiple intermediate clock signals to detect the false-lock condition, it increases the complexity of the DLL, which increases the time taken to achieve timing sign-off. Further, the DLL performs multiple iterations to achieve a true lock, which increases the external clock signal synchronization time. In addition, the false-lock detection circuit may fail to recover from a false-lock condition caused by the loss of the clock signal and hence, an external reset signal is needed to reset the DLL in such cases.

It would be advantageous to have a DLL that detects a false-lock condition, recovers from this condition without using an external reset signal, and can quickly achieve a true lock.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

Figure 1:
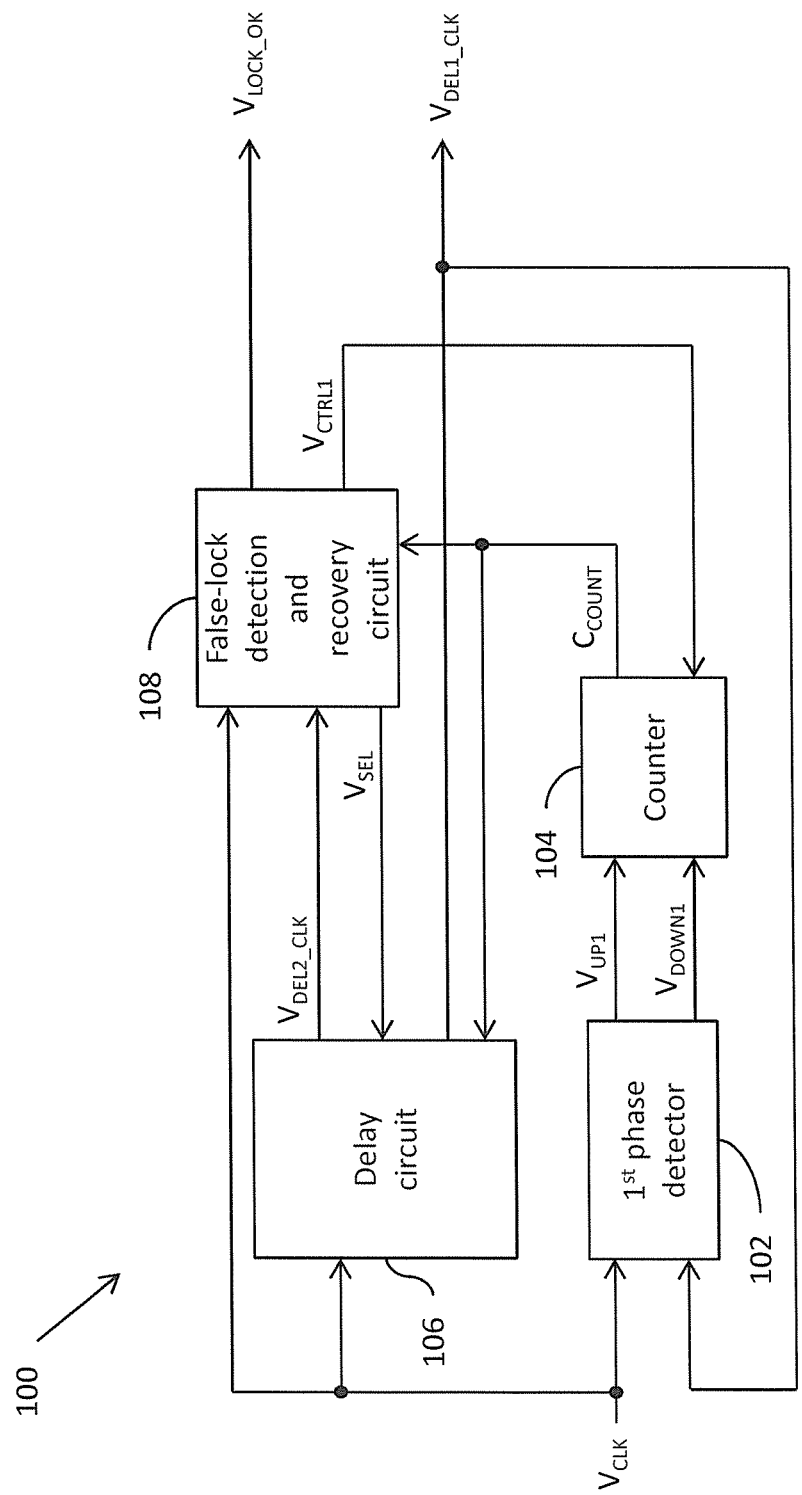
FIG. 1 is a schematic block diagram of a delay-locked loop (DLL) in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention. As used herein, the term multiplexer has been abbreviated as a mux.

In an embodiment of the present invention, a delay-locked loop (DLL) is provided. The DLL includes a phase detector, a counter, a delay circuit, and a false-lock detection and recovery circuit. The phase detector receives a clock signal and a first delayed version of the clock signal and generates up and down signals. The counter receives a control signal and the up and down signals, and generates a count value. The counter modifies the count value based on the control signal when the DLL is not in a true-lock condition. The delay circuit receives the clock signal, a select signal, and the count value, and generates the first delayed version of the clock signal based on the count value and a second delayed version of the clock signal based on the count value and the select signal. The false-lock detection and recovery circuit receives the clock signal, the count value, and the second delayed version of the clock signal, and generates the control signal and the select signal.

In another embodiment of the present invention, a DLL is provided. The DLL includes a first phase detector, a counter, a delay circuit, and a false-lock detection and recovery circuit. The first phase detector receives a clock signal and a first delayed version of the clock signal and generates first up and first down signals. The counter receives a first control signal, and the first up and first down signals, and generates a count value. The counter modifies the count value based on the first control signal when the DLL is not in a true-lock condition. The delay circuit receives the clock signal, a select signal, and the count value, and generates the first delayed version of the clock signal based on the count value and a second delayed version of the clock signal based on the count value and the select signal. The false-lock detection and recovery circuit includes a second phase detector, a charge pump, an analog-to-digital converter (ADC), and a controller. The second phase detector receives a tied high signal, the clock signal, a second control signal, and the second delayed version of the clock signal, and generates second up and second down signals. The second control signal is indicative of resetting the second phase detector. The charge pump receives the second up and second down signals and generates a third control signal. The ADC receives the third control signal and generates a digital output signal, which indicates an average of a phase difference between the clock signal and the second delayed version of the clock signal. The controller receives the clock signal, the count value, and the digital output signal, and generates the first and second control signals and the select signal.

In yet another embodiment of the present invention, a method for delaying a clock signal by a DLL is provided. The method includes receiving the clock signal. The method further includes generating a first delayed version of the clock signal based on a count value. The method further includes generating a second delayed version of the clock signal based on the count value and a select signal. The method further includes determining an average of a phase difference between the clock signal and the second delayed version of the clock signal. The method further includes determining whether the DLL is in a true-lock condition based on the average of the phase difference between the clock signal and the second delayed version of the clock signal. The method further includes modifying the count value when the DLL is not in the true-lock condition to generate a modified count value. The method further includes re-generating the first delayed version of the clock signal based on the modified count value.

Various embodiments of the present invention provide a DLL, which includes a false-lock detection and recovery circuit that checks whether the DLL is in a true-lock condition or not, based on an average of a phase difference between a clock signal and an intermediate clock signal. The intermediate clock signal is generated by a delay circuit based on a count value generated by the counter and a select signal generated by the false-lock detection and recovery circuit. The false-lock detection and recovery circuit generates and provides a control signal to a counter. Based on the control signal, the counter modifies the count value on which a delay between the clock signal and an output signal of the DLL depends, when the DLL is not in the true-lock condition. The DLL only uses one intermediate clock signal to determine whether a true lock has been achieved, and hence, the complexity of the DLL and the time required for achieving time sign-off are reduced. The counter modifies the count value such that a true lock is achieved in a single iteration.

Referring now to FIG. 1, a schematic block diagram of a delay-locked loop (DLL) 100 in accordance with an embodiment of the present invention is shown. The DLL 100 includes a first phase detector 102, a counter 104, a delay circuit 106, and a false-lock detection and recovery circuit 108.

The first phase detector 102 receives a clock signal $V_{CLK}$ and a first delayed version of the clock signal $V_{DEL1\_CLK}$ (hereinafter referred to as "first delayed clock signal $V_{DEL1\_CLK}$") and generates first up and first down signals $V_{UP1}$ and $V_{DOWN1}$. When the clock signal $V_{CLK}$ leads the first delayed clock signal $V_{DEL1\_CLK}$, the first phase detector 102 activates the first up signal $V_{UP1}$, and when the first delayed clock signal $V_{DEL1\_CLK}$ leads the clock signal $V_{CLK}$, the first phase detector 102 activates the first down signal $V_{DOWN1}$. When the first delayed clock signal $V_{DEL1\_CLK}$ is synchronized with the clock signal $V_{CLK}$, the first phase detector 102 deactivates the first up and first down signals $V_{UP1}$ and $V_{DOWN1}$.

The counter 104 is connected to the first phase detector 102 and receives the first up and first down signals $V_{UP1}$ and $V_{DOWN1}$. The counter 104 also receives a first control signal $V_{CTRL1}$ and generates a count value $C_{COUNT}$. The counter 104 modifies the count value $C_{COUNT}$ based on the first control signal $V_{CTRL1}$ when the DLL 100 is not in a true-lock condition.

The delay circuit 106 is connected to the counter 104 and receives the count value $C_{COUNT}$. The delay circuit 106 also receives the clock signal $V_{CLK}$ and a select signal $V_{SEL}$ and delays the clock signal $V_{CLK}$ to generate the first delayed clock signal $V_{DEL1\_CLK}$ based on the count value $C_{COUNT}$, and a second delayed version of the clock signal $V_{DEL2\_CLK}$ (hereinafter referred to as "second delayed clock signal $V_{DEL2\_CLK}$") based on the count value $C_{COUNT}$ and the select signal $V_{SEL}$. The delay circuit 106 will be explained in detail in conjunction with FIG. 2 below.

The false-lock detection and recovery circuit 108 is connected to the counter 104 and the delay circuit 106, and receives the count value $C_{COUNT}$ and the second delayed clock signal $V_{DEL2\_CLK}$. The false-lock detection and recovery circuit 108 also receives the clock signal $V_{CLK}$ and generates the first control signal $V_{CTRL1}$ and the select signal $V_{SEL}$. The false-lock detection and recovery circuit 108 may also provide a lock ok signal $V_{LOCK\_OK}$ that indicates whether the DLL 100 is in the true-lock condition or not. The false-lock detection and recovery circuit 108 will be explained in detail in conjunction with FIG. 3.

Figure 2:
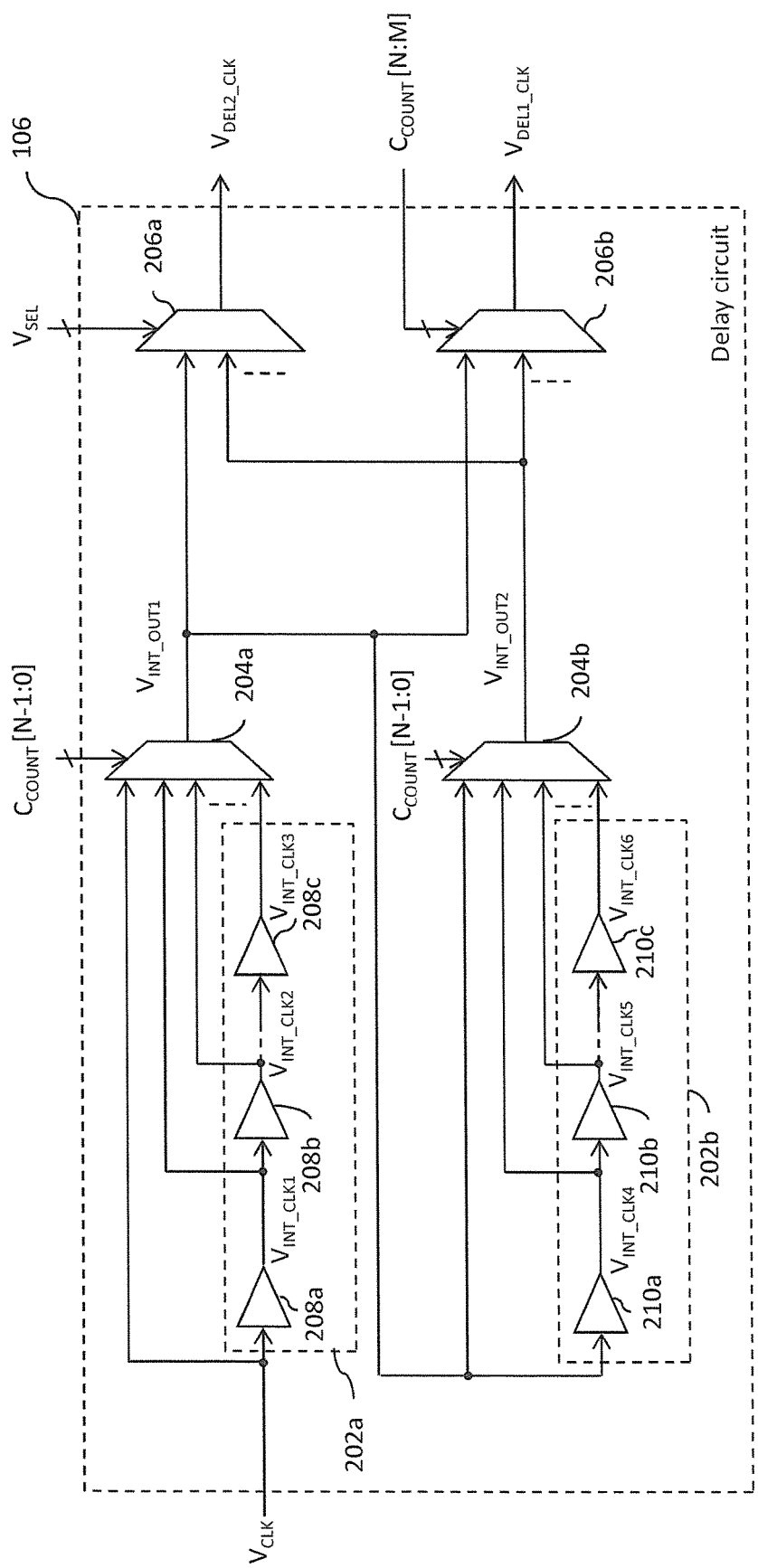
FIG. 2 is a schematic block diagram of a delay circuit of the DLL of FIG. 1 in accordance with an embodiment of the present invention.

FIG. 2 is a schematic block diagram of the delay circuit 106 in accordance with an embodiment of the present invention. The delay circuit 106 includes a plurality of delay chains 202, two of which are shown—first and second delay chains 202a and 202b. Each delay chain 202 has a corresponding mux 204, two of which are shown, first and second muxes 204a and 204b that correspond to the first and second delay chains 202a and 202b, respectively. The delay circuit 106 also includes third and fourth muxes 206a and 206b.

The first delay chain 202a includes series-connected delay elements 208, three of which are shown—first through third delay elements 208a-208c (collectively referred to as the "delay elements 208"). The second delay chain 202b includes series-connected delay elements, three of which are shown—fourth through sixth delay elements 210a-210c (collectively referred to as the "delay elements 210"). In one embodiment, the delay elements 208 and 210 are inverters.

The first delay chain 202a receives the clock signal $V_{CLK}$ and generates first through third intermediate clock signals $V_{INT\_CLK1}$-$V_{INT\_CLK3}$. The first through third intermediate clock signals $V_{INT\_CLK1}$-$V_{INT\_CLK3}$ (collectively referred to as "first set of intermediate clock signals $V_{INT\_CLK1}$-$V_{INT\_CLK3}$") are generated by the first through third delay elements 208a-208c, respectively. The first mux 204a has input terminals that are connected to the first delay chain 202a and receives the first set of intermediate clock signals $V_{INT\_CLK1}$-$V_{INT\_CLK3}$. The first mux 204a also receives the clock signal $V_{CLK}$, has a select terminal that is connected to the counter 104 to receive a first set of data bits of the count value $C_{COUNT}[N-1:0]$, and an output terminal to output a first intermediate output signal $V_{INT\_OUT1}$. The first set of data bits of the count value $C_{COUNT}[N-1:0]$ are least significant bits (LSBs) of the count value $C_{COUNT}$.

The second delay chain 202b is connected to the first mux 204a and receives the first intermediate output signal $V_{INT\_OUT1}$, and generates fourth through sixth intermediate clock signals $V_{INT\_CLK4}$-$V_{INT\_CLK6}$ (collectively referred to as the "second set of intermediate clock signals $V_{INT\_CLK4}$-$V_{INT\_CLK6}$"). The fourth through sixth intermediate clock signals $V_{INT\_CLK4}$-$V_{INT\_CLK6}$ are generated by the fourth through sixth delay elements 210a-210c, respectively. The second mux 204b has input terminals that are connected to the first mux 204a and the second delay chain 202b to receive the first intermediate output signal $V_{INT\_OUT1}$ and the second set of intermediate clock signals $V_{INT\_CLK4}$-$V_{INT\_CLK6}$, respectively, a select terminal that is connected to the counter 104 to receive the first set of data bits of the count value $C_{COUNT}[N-1:0]$, and an output terminal to output a second intermediate output signal $V_{INT\_OUT2}$.

The third mux 206a has input terminals that are connected to the first and second muxes 204a and 204b to receive the first and second intermediate output signals $V_{INT\_OUT1}$ and $V_{INT\_OUT2}$, respectively, a select terminal that is connected to the false-lock detection and recovery circuit 108 to receive the select signal $V_{SEL}$, and an output terminal to output the second delayed clock signal $V_{DEL2\_CLK}$.

The fourth mux 206b has input terminals that are connected to the first and second muxes 204a and 204b to receive the first and second intermediate output signals $V_{INT\_OUT1}$ and $V_{INT\_OUT2}$, respectively, a select terminal that is connected to the counter 104 to receive a second set of data bits of the count value $C_{COUNT}$[N:M], and an output terminal to output the first delayed clock signal $V_{DEL1\_CLK}$. The second set of data bits of the count value $C_{COUNT}$[N:M] are most significant bits (MSBs) of the count value $C_{COUNT}$.

Figure 3:
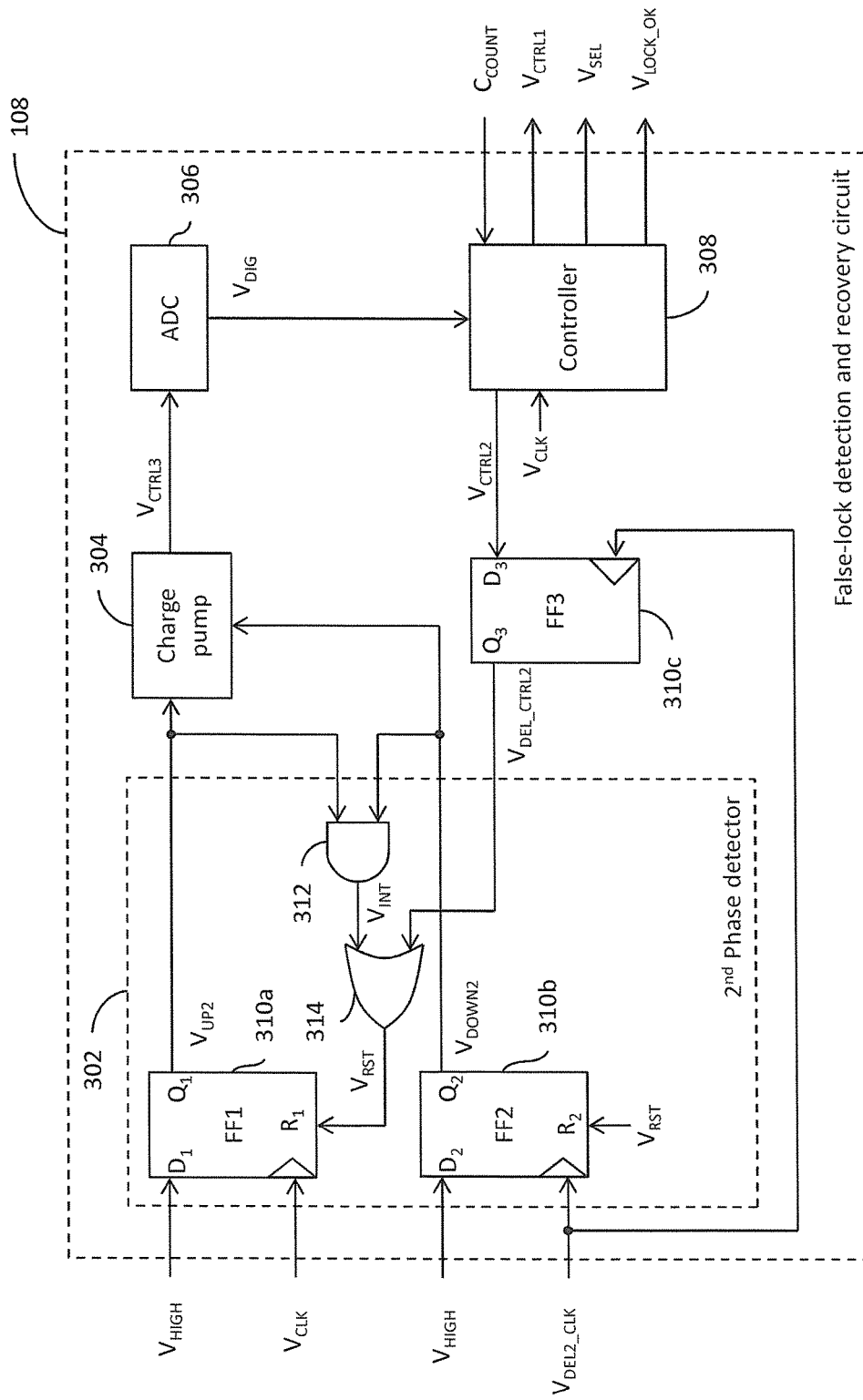
FIG. 3 is a schematic block diagram of a false-lock detection and recovery circuit of the DLL of FIG. 1 in accordance with an embodiment of the present invention.

FIG. 3 is a schematic block diagram of the false-lock detection and recovery circuit 108 in accordance with an embodiment of the present invention. The false-lock detection and recovery circuit 108 includes a second phase detector 302, a charge pump 304, an analog-to-digital converter (ADC) 306, and a controller 308. The second phase detector 302 includes first and second flip-flops 310a and 310b, and first and second logic gates 312 and 314. In one embodiment, the first and second flip-flops 310a and 310b are D-type flip-flops, the first logic gate 312 is an AND gate, and the second logic gate 314 is an OR gate.

The first flip-flop 310a has an input terminal that receives a tied high signal $V_{HIGH}$, a clock terminal that receives the clock signal $V_{CLK}$, a reset terminal that receives a reset signal $V_{RST}$, and an output terminal that generates a second up signal $V_{UP2}$. The second flip-flop 310b has an input terminal that receives the tied high signal $V_{HIGH}$, a clock terminal that is connected to the output terminal of the third mux 206a to receive the second delayed clock signal $V_{DEL2\_CLK}$, a reset terminal that receives the reset signal $V_{RST}$, and an output terminal that generates a second down signal $V_{DOWN2}$.

The first logic gate 312 has first and second input terminals connected to the first and second flip-flops 310a and 310b to receive the second up and second down signals $V_{UP2}$ and $V_{DOWN2}$, respectively, and an output terminal to output an intermediate signal $V_{INT}$. The second logic gate 314 has a first input terminal connected to the output terminal of the first logic gate 312 to receive the intermediate signal $V_{INT}$, a second input terminal to receive a second control signal $V_{CTRL2}$, and an output terminal to output the reset signal $V_{RST}$.

The false-lock detection and recovery circuit 108 may also include a third flip-flop 310c that delays the second control signal $V_{CTRL2}$ and provides a delayed version of the second control signal $V_{DEL\_CTRL2}$ (hereinafter referred to as "delayed second control signal $V_{DEL\_CTRL2}$") to the second logic gate 314. Thus, instead of receiving the second control signal $V_{CTRL2}$, the second logic gate 314 receives the delayed second control signal $V_{DEL\_CTRL2}$.

The charge pump 304 is connected to the first and second flip-flops 310a and 310b to receive the second up and second down signals $V_{UP2}$ and $V_{DOWN2}$, respectively, and generates a third control signal $V_{CTRL3}$.

The ADC 306 is connected to the charge pump 304 to receive the third control signal $V_{CTRL3}$ and generates a digital output signal $V_{DIG}$. Thus, the digital output signal $V_{DIG}$ indicates an average of a phase difference between the clock signal $V_{CLK}$ and the second delayed clock signal $V_{DEL2\_CLK}$ (hereinafter referred to as the "average phase difference value"). When the average phase difference value is greater than a first threshold value and less than a second threshold value, the DLL 100 is in the true-lock condition. When the average phase difference value is greater than the second threshold value, the DLL 100 is in a false-lock condition. When the average phase difference value is less than the first threshold value, it indicates start-up failure of the DLL 100.

The controller 308 is connected to the counter 104 and the ADC 306, receives the count value $C_{COUNT}$, the digital output signal $V_{DIG}$, and the clock signal $V_{CLK}$, and generates the first and second control signals $V_{CTRL1}$ and $V_{CTRL2}$ and the select signal $V_{SEL}$. During start-up of the DLL 100, the controller 308 activates the second control signal $V_{CTRL2}$ to reset the first and second flip-flops 310a and 310b, thereby resetting the second phase detector 302. This avoids generation of an inverted second up signal $V_{UP2}$ (i.e., corrupted second up signal $V_{UP2}$, which generally occurs during start-up of the DLL 100), and hence, prevents the DLL 100 from malfunctioning.

Figure 4:
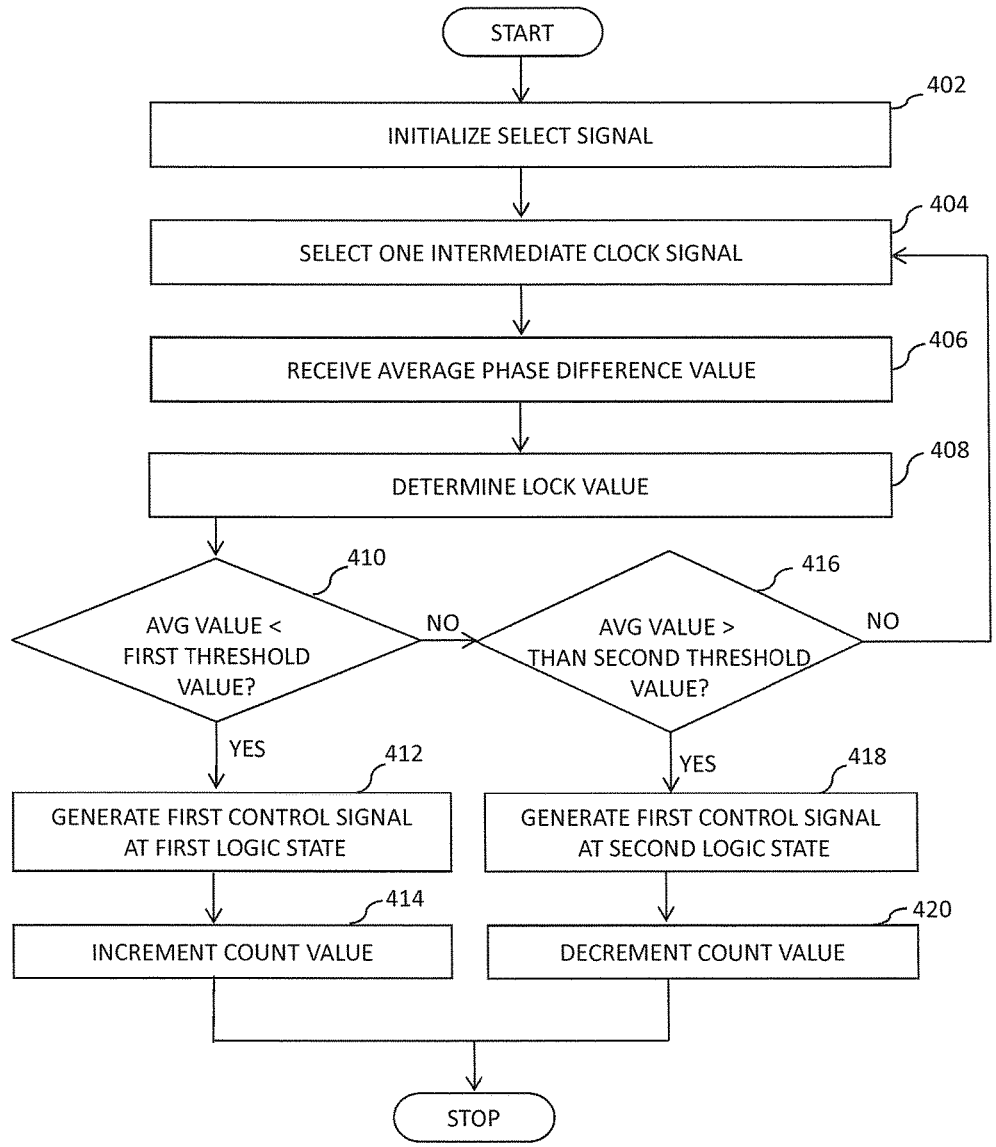
FIG. 4 is a flow chart illustrating the operation of a controller of the false-lock detection and recovery circuit of FIG. 3 in accordance with an embodiment of the present invention.

Referring now to FIG. 4, a flow chart illustrating the operation of the controller 308 in accordance with an embodiment of the present invention is shown. At step 402, the controller 308 initializes the select signal $V_{SEL}$ to a predetermined value. At step 404, the controller 308 selects one of the outputs of the muxes 204 (i.e., an intermediate clock signal) as the second delayed clock signal $V_{DEL2\_CLK}$ using the select signal $V_{SEL}$. At step 406, the controller 308 receives the digital output signal $V_{DIG}$. At step 408, the controller 308 determines a lock value $C_{LOCK}$. The lock value $C_{LOCK}$ indicates the phase difference between the clock signal $V_{CLK}$ and the first delayed clock signal $V_{DEL1\_CLK}$. At step 410, the controller 308 checks to determine whether the average phase difference value is less than the first threshold value. If at step 410, the controller 308 determines that the average phase difference value is greater than the first threshold value, the controller 308 executes step 416. At step 412, the controller 308 generates the first control signal $V_{CTRL1}$ at a first logic state. At step 414, the counter 104 increments the count value $C_{COUNT}$, and thereby generates a modified count value $C_{MOD\_COUNT}$. In one embodiment, the modified count value $C_{MOD\_COUNT}$ is given using expression (1):

$$C_{MOD\_COUNT} = C_{COUNT\_INIT} + K \quad (1)$$

where, $C_{COUNT\_INIT}$=initial count value $C_{COUNT}$, and K is an integral value.

The value of 'K' is selected such that the DLL 100 achieves a true lock in a single iteration.

At step 416, the controller 308 checks to determine whether the average phase difference value is greater than the second threshold value. If at step 416, the controller 308 determines that the average phase difference value is less than the second threshold value, the controller 308 executes step 404. At step 418, the controller 308 generates the first control signal $V_{CTRL1}$ at a second logic state. At step 420, the counter 104 decrements the count value $C_{COUNT}$, and thereby generates the modified count value $C_{MOD\_COUNT}$. In one embodiment, the modified count value $C_{MOD\_COUNT}$ is given using expression (2):

$$C_{MOD\_COUNT} = C_{COUNT\_INIT} * (1/C_{LOCK}) \quad (2)$$

In an example, the count value $C_{COUNT}$ is 4, the phase difference between the clock signal $V_{CLK}$ and the first delayed clock signal $V_{DEL1\_CLK}$ is $4\pi$ radians, the predetermined value to which the select signal $V_{SEL}$ is initialized is 1, the first threshold value is 2, and the second threshold value is 6. The lock value $C_{LOCK}$ is 1 when the phase difference between the clock signal $V_{CLK}$ and the first delayed clock signal $V_{DEL1\_CLK}$ is $2\pi$ radians, the lock value $C_{LOCK}$ is 2 when the phase difference between the clock signal $V_{CLK}$ and the first delayed clock signal $V_{DEL1\_CLK}$ is $4\pi$ radians, and so on. Since the count value $C_{COUNT}$ is 4, the delay circuit 106 outputs the fourth intermediate clock signal $V_{INT\_CLK4}$ as the first delayed clock signal $V_{DEL1\_CLK}$. The controller 308 initializes the select signal $V_{SEL}$ to 1 and determines the average phase difference value to be 8. Since the phase difference between the clock signal $V_{CLK}$ and the first delayed clock signal $V_{DEL1\_CLK}$ is $4\pi$ radians, the controller 308 determines the lock value $C_{LOCK}$ as 2. Since the average phase difference value is greater than the second threshold value (i.e., 6), the controller 308 generates the first control signal $V_{CTRL1}$ at the second logic state. Thus, the counter 104 decrements the count value $C_{COUNT}$ to 2 (using expression 2). Hence, the delay circuit 106 outputs the second intermediate clock signal $V_{INT2\_CLK}$ as the first delayed clock signal $V_{DEL1\_CLK}$. The controller 308 performs steps 402-406 again and determines the average phase difference value to be 4, which is greater than the first threshold value and less than the second threshold value. Thus, the DLL 100 achieves a true lock in a single iteration.

In an embodiment, the first control signal $V_{CTRL1}$ is a single-bit signal, and the first logic state is a logic high state and the second logic state is a logic low state, or vice-versa. In another embodiment, the first control signal $V_{CTRL1}$ is a multi-bit signal, and the first and second logic states correspond to the respective predefined values. In yet another embodiment, the value of the multi-bit first control signal $V_{CTRL1}$ varies depending on the extent to which modification in the count value $C_{COUNT}$ is required to achieve a true lock.

In one embodiment, the controller 308 repeats steps 402-406 in a loop for a predetermined number of times before step 408 is performed. Thus, instead of comparing the average phase difference value with the first and second threshold values, the controller 308 compares a mean of the averages of the phase difference between the clock signal $V_{CLK}$ and the second delayed clock signal $V_{DEL2\_CLK}$. The phase difference between the clock signal $V_{CLK}$ and the second delayed clock signal $V_{DEL2\_CLK}$ varies, based on the select signal $V_{SEL}$. The number of times the loop is executed depends on the requirement for accuracy and the complexity of the DLL 100.

Thus, the DLL 100 detects and recovers from the false-lock condition without utilizing an external reset signal. Since the controller 308 uses only one intermediate clock signal for determining whether the DLL 100 is in the true-lock condition, the complexity of the DLL 100 is reduced, and hence, the time required for timing sign-off is also reduced. The count value $C_{COUNT}$ is modified such that the DLL 100 achieves a true lock in a single iteration. The DLL 100 can be used in applications such as, but are not limited to, elimination of clock skew and generation of multi-phase clock signals. The DLL 100 can be used in integrated circuits (ICs) which operate on a clock signal that changes its frequency during run time. An example of such an IC includes double data rate (DDR) memory controllers.

Figure 5:
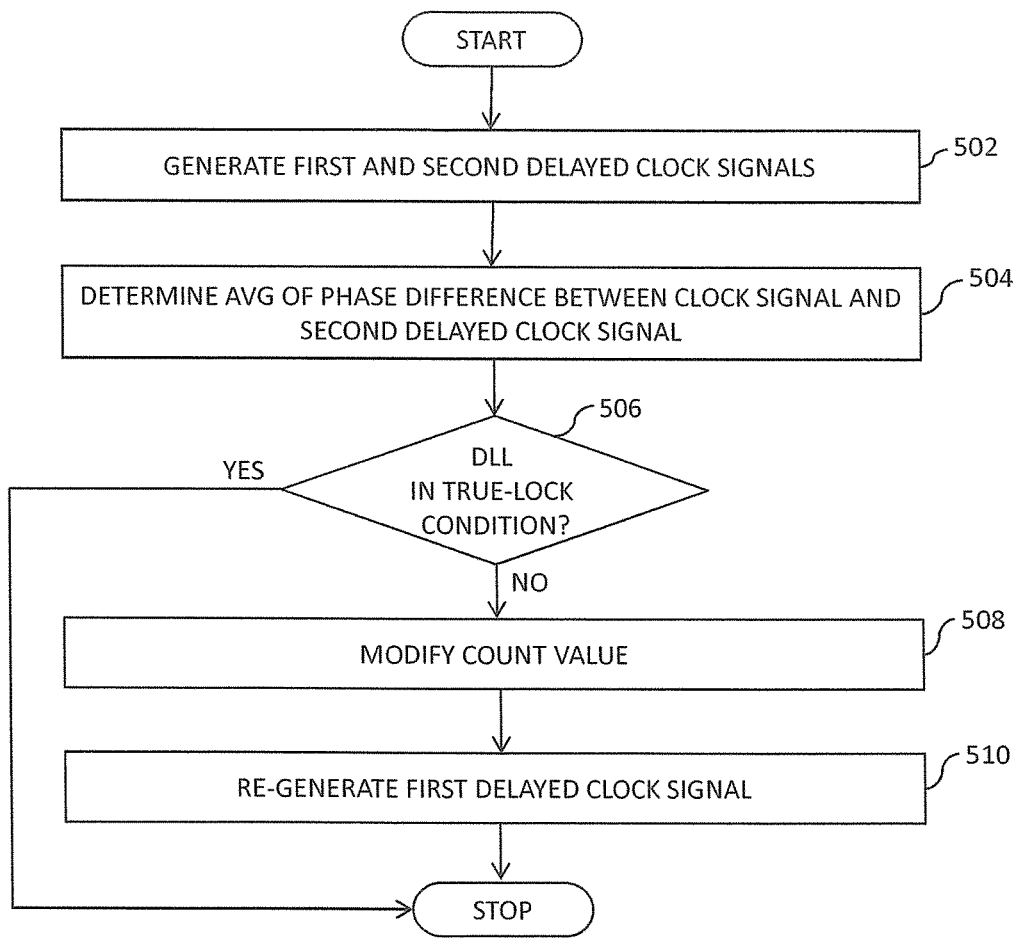
FIG. 5 is a flow chart illustrating a method for delaying a clock signal by the DLL of FIG. 1 in accordance with an embodiment of the present invention.

Referring now to FIG. 5, a flow chart illustrating a method for delaying the clock signal $V_{CLK}$ by the DLL 100 in accordance with an embodiment of the present invention is shown. At step 502, the delay circuit 106 generates the first delayed clock signal $V_{DEL1\_CLK}$ based on the count value $C_{COUNT}$, and the second delayed clock signal $V_{DEL2\_CLK}$ based on the count value $C_{COUNT}$ and the select signal $V_{SEL}$. At step 504, the second phase detector 302 determines the phase difference between the clock signal $V_{CLK}$ and the second delayed clock signal $V_{DEL2\_CLK}$. At step 506, the controller 308 determines whether the DLL 100 is in the true-lock condition. If at step 506, the controller 308 determines that the DLL 100 is not in the true-lock condition, the controller 308 executes step 508. At step 508, the controller 308 modifies the count value $C_{COUNT}$ to generate the modified count value $C_{MOD\_COUNT}$. At step 510, the delay circuit 106 re-generates the first delayed clock signal $V_{DEL1\_CLK}$, based on the modified count value $C_{MOD\_COUNT}$.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A delay-locked loop (DLL), comprising:
   a first phase detector that receives a clock signal and a first delayed version of the clock signal and generates first up and down signals;
   a counter that is connected to the first phase detector and receives the first up and first down signals, receives a first control signal, and generates a count value, wherein the counter modifies the count value based on the first control signal when the DLL is not in a true-lock condition;
   a delay circuit that receives the clock signal and a select signal, and is connected to the counter for receiving the count value, and generates the first delayed version of the clock signal based on the count value and a second delayed version of the clock signal based on the count value and the select signal; and
   a false-lock detection and recovery circuit, connected to the counter and the delay circuit, that receives the clock signal, the count value, and the second delayed version of the clock signal, and generates the select signal and the first control signal, wherein the DLL is in the true-lock condition when the average of the phase difference between the clock signal and the second delayed version of the clock signal is greater than a first threshold value and less than a second threshold value.

2. The DLL of claim 1, wherein the false-lock detection and recovery circuit comprises:
   a second phase detector that receives a tied high signal, the clock signal, and a second control signal, and is connected to the delay circuit for receiving the second delayed version of the clock signal, and generates second up and second down signals, wherein the second control signal is indicative of resetting the second phase detector;
   a charge pump, connected to the second phase detector, that receives the second up and second down signals and generates a third control signal;
   an analog-to-digital converter (ADC), connected to the charge pump, that receives the third control signal and generates a digital output signal, wherein the digital output signal indicates an average of a phase difference between the clock signal and the second delayed version of the clock signal; and
   a controller that receives the clock signal, and is connected to the counter and the ADC for receiving the count value and the digital output signal, respectively, and generates the first and second control signals and the select signal.

3. The DLL of claim 2, wherein the second phase detector comprises:
   a first flip-flop having an input terminal that receives the tied high signal, a clock terminal that receives the clock signal, a reset terminal that receives a reset signal, and an output terminal that generates the second up signal;

a second flip-flop having an input terminal that receives the tied high signal, a clock terminal that is connected to the delay circuit for receiving the second delayed version of the clock signal, a reset terminal that receives the reset signal, and an output terminal that generates the second down signal;

a first logic gate, connected to the first and second flip-flops, that receives the second up and second down signals and outputs an intermediate signal; and a second logic gate, connected to the controller and the first logic gate, that receives the second control signal and the intermediate signal and outputs the reset signal.

4. The DLL of claim 2, wherein the controller generates the first control signal at a first logic state when the average of the phase difference between the clock signal and the second delayed version of the clock signal is less than the first threshold value, and wherein the counter increments the count value when the first control signal is at the first logic state.

5. The DLL of claim 4, wherein the controller generates the first control signal at a second logic state when the average of the phase difference between the clock signal and the second delayed version of the clock signal is greater than the second threshold value, and wherein the counter decrements the count value when the first control signal is at the second logic state.

6. The DLL of claim 1, wherein the DLL uses only one intermediate clock signal to determine whether a true lock has been achieved.

7. The DLL of claim 1, wherein the delay circuit comprises:

a first delay chain that receives the clock signal and generates a first set of intermediate clock signals;

a first multiplexer having input terminals for receiving the clock signal and the first set of intermediate clock signals, a select terminal connected to the counter for receiving a first set of data bits of the count value, and an output terminal that outputs a first intermediate output signal;

a second delay chain, connected to the first multiplexer, that receives the first intermediate output signal and generates a second set of intermediate clock signals;

a second multiplexer having input terminals for receiving the first intermediate output signal and the second set of intermediate clock signals, a select terminal connected to the counter for receiving the first set of data bits of the count value, and an output terminal that outputs a second intermediate output signal;

a third multiplexer having input terminals connected to the first and second multiplexers for receiving the first and second intermediate output signals, respectively, a select terminal connected to the false-lock detection and recovery circuit for receiving the select signal, and an output terminal that outputs the second delayed version of the clock signal; and a fourth multiplexer having input terminals connected to the first and second multiplexers for receiving the first and second intermediate output signals, respectively, a select terminal connected to the counter for receiving a second set of data bits of the count value, and an output terminal that outputs the first delayed version of the clock signal.

8. A delay-locked loop (DLL), comprising:

a first phase detector that receives a clock signal and a first delayed version of the clock signal and generates first up and first down signals;

a counter that receives a first control signal, and is connected to the first phase detector for receiving the first up and first down signals, and generates a count value, wherein the counter modifies the count value based on the first control signal when the DLL is in not in a true-lock condition;

a delay circuit that receives the clock signal and a select signal, and is connected to the counter for receiving the count value, and generates the first delayed version of the clock signal based on the count value and a second delayed version of the clock signal based on the count value and the select signal;

a second phase detector that receives a tied high signal, the clock signal, and a second control signal, and is connected to the delay circuit for receiving the second delayed version of the clock signal, and generates second up and second down signals, wherein the second control signal is indicative of resetting the second phase detector;

a charge pump, connected to the second phase detector, that receives the second up and second down signals and generates a third control signal;

an analog-to-digital converter (ADC), connected to the charge pump, that receives the third control signal and generates a digital output signal, wherein the digital output signal indicates an average of a phase difference between the clock signal and the second delayed version of the clock signal; and a controller that receives the clock signal, and is connected to the counter and the ADC for receiving the count value and the digital output signal, respectively, and generates the first and second control signals and the select signal, wherein the DLL is in the true-lock condition when the average of the phase difference between the clock signal and the second delayed version of the clock signal is greater than a first threshold value and less than a second threshold value.

9. The DLL of claim 8, wherein the second phase detector comprises:

a first flip-flop having an input terminal that receives the tied high signal, a clock terminal that receives the clock signal, a reset terminal that receives a reset signal, and an output terminal that generates the second up signal;

a second flip-flop having an input terminal that receives the tied high signal, a clock terminal that is connected to the delay circuit for receiving the second delayed version of the clock signal, a reset terminal that receives the reset signal, and an output terminal that generates the second down signal;

a first logic gate, connected to the first and second flip-flops, that receives the second up and second down signals and outputs an intermediate signal; and a second logic gate, connected to the controller and the first logic gate, that receives the second control signal and the intermediate signal and outputs the reset signal.

10. The DLL of claim 8, wherein the controller generates the first control signal at a first logic state when the average of the phase difference between the clock signal and the second delayed version of the clock signal is less than the first threshold value, and wherein the counter increments the count value when the first control signal is at the first logic state.

11. The DLL of claim 10, wherein the controller generates the first control signal at a second logic state when the average of the phase difference between the clock signal and the second delayed version of the clock signal is greater than the second threshold value, and wherein the counter decrements the count value when the first control signal is at the second logic state.

12. The DLL of claim 8, wherein the DLL uses only one intermediate clock signal to determine whether a true lock has been achieved.

13. The DLL of claim 8, wherein the delay circuit comprises:
- a first delay chain that receives the clock signal and generates a first set of intermediate clock signals;
- a first multiplexer having input terminals for receiving the clock signal and the first set of intermediate clock signals, a select terminal connected to the counter for receiving a first set of data bits of the count value, and an output terminal that outputs a first intermediate output signal;
- a second delay chain, connected to the first multiplexer, that receives the first intermediate output signal and generates a second set of intermediate clock signals;
- a second multiplexer having input terminals for receiving the first intermediate output signal and the second set of intermediate clock signals, a select terminal connected to the counter for receiving the first set of data bits of the count value, and an output terminal that outputs a second intermediate output signal;
- a third multiplexer having input terminals connected to the first and second multiplexers for receiving the first and second intermediate output signals, respectively, a select terminal connected to the false-lock detection and recovery circuit for receiving the select signal, and an output terminal that outputs the second delayed version of the clock signal; and
- a fourth multiplexer having input terminals connected to the first and second multiplexers for receiving the first and second intermediate output signals, respectively, a select terminal connected to the counter for receiving a second set of data bits of the count value, and an output terminal that outputs the first delayed version of the clock signal.

14. A method for delaying a clock signal by a delay-locked loop (DLL), the method comprising:
- generating first and second delayed versions of the clock signal based on a count value and a select signal;
- determining an average of a phase difference between the clock signal and the second delayed version of the clock signal;
- determining whether the DLL is in a true-lock condition based on the average of the phase difference between the clock signal and the second delayed version of the clock signal;
- modifying the count value when the DLL is not in the true-lock condition; and
- re-generating the first delayed version of the clock signal based on the modified count value,
- wherein the DLL is in the true-lock condition when the average of the phase difference between the clock signal and the second delayed version of the clock signal is greater than a first threshold value and less than a second threshold value.

15. The method of claim 14, wherein the DLL uses only one intermediate clock signal to determine whether a true lock has been achieved.

16. The method of claim 14, wherein modifying the count value comprises incrementing the count value when the average of the phase difference between the clock signal and the second delayed version of the clock signal is less than the first threshold value.

17. The method of claim 14, wherein modifying the count value comprises decrementing the count value when the average of the phase difference between the clock signal and the second delayed version of the clock signal is greater than the second threshold value.

* * * * *